(12) United States Patent
Donofrio et al.

(10) Patent No.: US 8,940,561 B2
(45) Date of Patent: Jan. 27, 2015

(54) SYSTEMS AND METHODS FOR APPLICATION OF OPTICAL MATERIALS TO OPTICAL ELEMENTS

(75) Inventors: Matthew Donofrio, Raleigh, NC (US); Nathaniel O. Cannon, Durham, NC (US)

(73) Assignee: Cree, Inc., Durham, NC (US)

(*) Notice: Subject to any disclaimer, the term of this patent is extended or adjusted under 35 U.S.C. 154(b) by 157 days.

(21) Appl. No.: 12/717,048

(22) Filed: Mar. 3, 2010

(65) Prior Publication Data

US 2010/0155763 A1 Jun. 24, 2010

Related U.S. Application Data

(63) Continuation-in-part of application No. 12/014,404, filed on Jan. 15, 2008, now Pat. No. 8,058,088.

(51) Int. Cl.
*H01L 21/00* (2006.01)
*H01L 33/50* (2010.01)
*B05B 7/06* (2006.01)

(52) U.S. Cl.
CPC .............. *H01L 33/50* (2013.01); *B05B 7/066* (2013.01); *H01L 2933/041* (2013.01)
USPC ........... 438/26; 438/27; 438/29; 257/E33.061

(58) Field of Classification Search
CPC ............ H01L 2933/0041; H01L 33/502; H01L 33/56; H01L 2924/12041; H01L 21/56
USPC ........ 438/48, 65, 69, 26, 27, 29; 257/98, 100, 257/E33.061, E33.067
See application file for complete search history.

(56) References Cited

U.S. PATENT DOCUMENTS

| | | | |
|---|---|---|---|
| 2,736,671 | A | 2/1956 | Ransburg et al. |
| 4,415,123 | A | 11/1983 | Ikeuchi |
| 4,918,497 | A | 4/1990 | Edmond |
| 4,966,862 | A | 10/1990 | Edmond |
| 5,027,168 | A | 6/1991 | Edmond |
| 5,210,051 | A | 5/1993 | Carter, Jr. |
| 5,338,944 | A | 8/1994 | Edmond et al. |
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |

(Continued)

FOREIGN PATENT DOCUMENTS

| | | |
|---|---|---|
| EP | 1-198-016 A2 | 4/2002 |
| JP | 2003-282952 A | 10/2003 |

(Continued)

OTHER PUBLICATIONS

International Search Report and Written Opinion of the International Searching Authority, or the Declaration corresponding to International Application No. PCT/US 11/25794; Date of Mailing: May 9, 2011; 11 Pages.

(Continued)

*Primary Examiner* — Minh-Loan Tran
(74) *Attorney, Agent, or Firm* — Myers Bigel Sibley & Sajovec, P.A.

(57) ABSTRACT

Methods are disclosed including heating an optical element. An optical material is applied to the heated optical element to provide a conformal layer that is cured via the thermal energy in the heated optical element.

44 Claims, 12 Drawing Sheets

(56) References Cited

U.S. PATENT DOCUMENTS

| | | |
|---|---|---|
| 5,631,190 A | 5/1997 | Negley |
| 5,739,554 A | 4/1998 | Edmond et al. |
| 5,912,477 A | 6/1999 | Negley |
| 5,959,316 A | 9/1999 | Lowery |
| 5,998,925 A | 12/1999 | Shimizu et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,576,488 B2 | 6/2003 | Collins, III et al. |
| 6,924,596 B2 | 8/2005 | Sato et al. |
| 6,960,878 B2 | 11/2005 | Sakano et al. |
| 7,304,325 B2 | 12/2007 | Uemura et al. |
| 7,326,583 B2 | 2/2008 | Andrews et al. |
| 7,390,684 B2 | 6/2008 | Izuno et al. |
| 7,442,564 B2 | 10/2008 | Andrews |
| 7,521,728 B2 | 4/2009 | Andrews |
| 7,646,035 B2 | 1/2010 | Loh et al. |
| 2002/0123164 A1 | 9/2002 | Slater et al. |
| 2003/0006418 A1 | 1/2003 | Emerson et al. |
| 2003/0089918 A1 | 5/2003 | Hiller et al. |
| 2004/0056260 A1 | 3/2004 | Slater et al. |
| 2005/0218421 A1 | 10/2005 | Andrews et al. |
| 2005/0224821 A1 | 10/2005 | Sakano et al. |
| 2005/0224830 A1 | 10/2005 | Blonder et al. |
| 2006/0054076 A1 | 3/2006 | Dwilinski et al. |
| 2006/0124953 A1 | 6/2006 | Negley et al. |
| 2006/0170332 A1* | 8/2006 | Tamaki et al. ............... 313/498 |
| 2006/0186431 A1 | 8/2006 | Miki et al. |
| 2006/0226758 A1 | 10/2006 | Sofue et al. |
| 2007/0045641 A1 | 3/2007 | Yin Chua et al. |
| 2007/0045761 A1* | 3/2007 | Basin et al. ............... 257/440 |
| 2007/0080358 A1 | 4/2007 | Tsai |
| 2007/0080635 A1 | 4/2007 | Wang |
| 2007/0120135 A1 | 5/2007 | Soules et al. |
| 2007/0128745 A1* | 6/2007 | Brukilacchio et al. ......... 438/22 |
| 2007/0148332 A1 | 6/2007 | Lee et al. |
| 2007/0161135 A1 | 7/2007 | Keller et al. |
| 2008/0089053 A1 | 4/2008 | Negley |
| 2008/0217635 A1 | 9/2008 | Emerson et al. |
| 2008/0315235 A1* | 12/2008 | Murazaki ...................... 257/98 |
| 2009/0179213 A1 | 7/2009 | Cannon et al. |
| 2010/0155763 A1 | 6/2010 | Donofrio et al. |
| 2010/0181582 A1 | 7/2010 | Li et al. |
| 2010/0289044 A1 | 11/2010 | Krames et al. |
| 2010/0314656 A1 | 12/2010 | Jeong et al. |
| 2011/0180780 A1 | 7/2011 | Yoo et al. |
| 2011/0248305 A1 | 10/2011 | Ling |
| 2012/0129282 A1 | 5/2012 | Hsia et al. |

FOREIGN PATENT DOCUMENTS

| | | |
|---|---|---|
| JP | 2008-135539 | 6/2008 |
| JP | 2008-541412 A | 11/2008 |
| JP | 2009-076749 | 4/2009 |
| JP | 2010-080588 A | 4/2010 |
| WO | WO 2006/121197 A1 | 11/2006 |

OTHER PUBLICATIONS

International Preliminary Report on Patententability (IPRP) corresponding to International Application No. PCT/US2011/025794; Date of Mailing: Sep. 13, 2011; 9 Pages.

International Preliminary Report on Patentability Corresponding to International Application No. PCT/US2012/023069; Date of Mailing; Aug. 15, 2013; 12 Pages.

International Preliminary Report on Patentability Corresponding to International Application No. PCT/US2012/021630; Date of Mailing; Aug. 15, 2013; 13 Pages.

Japanese Office Action Corresponding to Japanese Patent Application No. 2012-556103; Dispatch Date: Oct. 21, 2013; Foreign Text, 4 Pages, English Translation Thereof, 4 Pages.

Japanese Office Action Corresponding to Japanese Patent Application No. 2012-556103; Dispatch Date; Jun. 4, 2014; Foreign Text: 3 Pages, English Translation Thereof, 4 Pages.

* cited by examiner

SYSTEMS AND METHODS FOR APPLICATION OF OPTICAL MATERIALS TO OPTICAL ELEMENTS

CROSS REFERENCE TO RELATED APPLICATION

This application is a continuation-in-part of U.S. application Ser. No. 12/014,404, filed Jan. 15, 2008 now U.S. Pat. No. 8,058,088, the disclosure of which is incorporated herein by reference in its entirety.

BACKGROUND

This invention relates to coating of semiconductor devices. In particular, this invention relates to the application of optical materials to optical elements. In particular embodiments, the invention relate to the application of optical coatings, such as phosphors and/or other particles, to optical elements of a semiconductor based light emitting device, such as light emitting diode based devices. In yet other embodiments, the invention relates to spraying optical elements with phosphor and/or other particles.

Light emitting diodes (LEDs) are semiconductor devices that convert electric energy to light. Inorganic LEDs typically include an active layer of semiconductor material formed between two oppositely doped layers. When a bias is applied across the active region, holes and/or electrons are injected into the active region. Recombination of holes and electrons in the active region generates light that can be emitted from the LED. The active region may include a single and/or double hetero junction, quantum well, or multiple quantum well structures with corresponding barrier layers and may include other layers. The structure of the device, and the material from which it is constructed, determine the intensity and wavelength of light emitted by the device. Recent advances in LED technology have resulted in highly efficient solid-state light sources that surpass the efficiency of incandescent and halogen light sources, providing light with equal or greater brightness in relation to input power.

Conventional LEDs generate narrow bandwidth, essentially monochromatic light. However, it is desirable to generate polychromatic light, such as white light, using solid state light sources. One way to produce white light from conventional LEDs is to combine different wavelengths of light from different LEDs. For example, white light can be produced by combining the light from red, green and blue emitting LEDs, or combining the light from blue and amber LEDs. This approach, however, requires the use of multiple LEDs to produce a single color of light, which can potentially increase the overall cost, size, complexity and/or heat generated by such a device. In addition, the different colors of light may also be generated from different types of LEDs fabricated from different material systems. Combining different LED types to form a white lamp can require costly fabrication techniques and can require complex control circuitry, since each device may have different electrical requirements and/or may behave differently under varied operating conditions (e.g. with temperature, current or time).

Light from a blue emitting LED has been converted to white light by surrounding the LED with a yellow phosphor, such as cerium-doped yttrium aluminum garnet (Ce:YAG). The phosphor material absorbs and "downconverts" some of the blue light generated by the LED. That is, the phosphor material generates light, such as yellow light, in response to absorbing the blue light. Thus, some of the blue light generated by the LED is converted to yellow light. Some of the blue light from the LED passes through the phosphor without being changed, however. The overall LED/phosphor structure emits both blue and yellow light, which combine to provide light that is perceived as white light.

LEDs have been combined with phosphor layers by dispensing a volume of phosphor-containing encapsulant material (e.g., epoxy resin or silicone) over the LED to cover the LED. In these methods, however, it can be difficult to control the geometry and/or thickness of the phosphor layer. As a result, light emitted from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing. In a stencil printing approach, multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the volumetric dispense method described above, the stenciling method may also present difficulties in controlling the geometry and/or layer thickness of the phosphor containing polymer. The stenciling composition may not fully fill the stencil opening, resulting in non-uniform layers. The phosphor-containing composition can also stick to the stencil opening, which may reduce the amount of composition remaining on the LED. These problems can result in LEDs having non-uniform color temperature and LEDs that are difficult to consistently reproduce with the same or similar emission characteristics.

Another conventional method for coating LEDs with a phosphor utilizes electrophoretic deposition (EPD). The conversion material particles are suspended in an electrolyte based solution. A plurality of LEDs are immersed in the electrolyte solution. One electrode from a power source is coupled to the LEDs, and the other electrode is arranged in the electrolyte solution. The bias from the power source is applied across the electrodes, which causes current to pass through the solution to the LEDs. This creates an electric field that causes the conversion material to be drawn to the LEDs, covering the LEDs with the conversion material.

After the LEDs are covered by the conversion material, they are removed from the electrolyte solution so that the LEDs and their conversion material can be covered by a protective resin. This adds an additional step to the process and the conversion material (phosphor particles) can be disturbed prior to the application of the epoxy. During the deposition process, the electric field in the electrolyte solution can also vary such that different concentrations of conversion material can be deposited across the LEDs. Additionally, the electric field in the electrolyte solution may act preferentially according to particle size thereby increasing the difficulty of depositing mixed phosphors of different particle sizes. The conversion particles can also settle in the solution, which can also result in different conversion material concentrations across the LEDs. The electrolyte solution can be stirred to prevent settling, but this presents the danger of disturbing the particles already on the LEDs.

Still another coating method for LEDs utilizes droplet deposition using systems similar to those in an ink jet printing apparatus. Droplets of a liquid phosphor-containing material are sprayed from a print head. The phosphor-containing droplets are ejected from a nozzle on the print head in response to pressure generated in the print head by a thermal bubble and/or by piezoelectric crystal vibrations. However, in order to control the flow of the phosphor-containing composition from the ink-jet print head, it may be necessary for the print head nozzle to be relatively small. In fact, it may be desirable to engineer the size and/or shape of the phosphor particles to prevent them from catching in the nozzle and clogging the print head.

Problems with conventional methods of applying phosphor and/or other optical materials may include increased cost, complexity, clumping, dripping, settling, stratification, and/or separation, which may result in a reduced conformity and/or uniformity of the optical materials thus applied.

SUMMARY

The present invention relates to an improvement in the application of optical materials, such as phosphor and/or other particles, to optical elements, such as light transmissive structures, reflectors, lens and/or the light emissive surface of a semiconductor light emitting device or other substrates or elements that interact with the emitted light, by the application of heat to the optical element before and/or during the application of the optical materials to the optical elements. Some embodiments of the invention include spraying optical materials onto a heated optical element, such as a semiconductor light emitting device or other optical element(s) spaced from the semiconductor light emitting device.

Some embodiments of the present invention relate to application of an optical material to an optical element, and exposing the optical material to a curing agent during the application. The curing agent may include heat, radiation, a material on or in the optical element, or other agents that speed up the curing process for the optical materials.

In some embodiments, the optical element may be heated to a temperature that is sufficient to control the flow of the optical materials to achieve the desired characteristics, such as coverage and/or uniformity. For example, the optical element can be heated to a temperature sufficient to gel, harden or fix the optical material on contact to prevent further movement of the optical material. The optical material that may include a luminescent material, such as a phosphor. Some embodiments provide that a luminescent material may include a solution, mixture, compound and/or suspension with optical materials therein. The optical material may be applied to the heated optical element. In some embodiments, the optical material and/or luminescent material may be sprayed onto a heated optical element using, for example, a flow of pressurized fluid (gas or liquid) and/or a mechanical liquid delivery mechanism, such as a pump and/or syringe type device, among others. In some embodiments, the flow of pressurized gas may be provided using an air pressurized spray system. Some embodiments provide that the optical material and/or luminescent material may be applied using direct contact operations such as, for example, using an applicator, such as a brush, pad and/or roller, dipping, and/or pouring, among others. By applying the optical material and/or or luminescent material to a heated optical element, the optical material and/or luminescent material may rapidly cure on the substrate via the thermal energy therein. In this manner, curing may be accomplished before any substantial running, settling, separating, stratifying, and/or pooling activities may occur. Thus, the cured optical material layer on the optical element may be controlled to achieve a desired shape, phosphor distribution or degree of conformity. For example, the optical material can be substantially conformal to the optical element, uniform in thickness and/or have a certain material density. Such features may be particularly effective when applying the optical materials and/or luminescent materials to non-planar and/or multi-planar substrates, components or materials.

In some embodiments, the luminescent solution includes wavelength conversion particles and/or phosphors suspended in a binder material. The binder material may be cured via thermal energy in the heated LED structure to provide the conformal layer including the wavelength conversion particles on the LED structure. Depending on the phosphor concentration and/or binder viscosity, a solvent may be added to sufficiently dilute the material to allow for improved application, such as improved atomization of the optical materials. In some embodiments, the solvent dilution ratio is between 10% and 50% by weight relative to the binder. In some embodiments, the dilution ratio is between 50% and 150% by weight relative to the binder. Higher solvent dilution ratios may result in faster particle settling times. Depending on application time, stirring, agitating and/or other mixing methods to maintain particles in suspension may be employed. As such, some embodiments provide that the luminescent solution includes wavelength conversion particles and/or phosphors suspended in a solution including a volatile solvent and a binder material. The volatile solvent may be evaporated via thermal energy in the heated optical element from the luminescent solution to provide a layer including wavelength conversion particles on the optical element.

In some embodiments, the optical element includes a light emitting diode (LED) structure, which can include an LED chip, a light emitting surface of the LED chip, active and/or passive optical components, such as lenses, diffusers, light transmissive layers, such as dielectric or passivation or spacer layers, substrates, packaging structures or components, optical elements on the LED chip or optical elements spaced from the LED chip or component, such as remote lenses, reflectors, diffusers or light transmissive elements. The concentration can be adjusted as a function of particle size, desired optical material thickness and/or thermal considerations, such as phosphor heating due to Stokes losses and flux density. Depending on the optical element to be coated, the particle concentration can be adjusted or changed to achieve the desired result. For example, if coating the LED chip with a wavelength converting material, higher concentrations of the wavelength converting material relative to the binder can be used, when compared to concentrations of wavelength converting material for applying to optical elements remote from the LED chip, to reduce phosphor heating from Stokes losses. Phosphor heating can be reduced with increased particle concentration to improve thermal conductivity between the particles themselves and to the optical element. In some embodiments, concentrations of greater than 40% by weight with layer thicknesses of 20-150 microns, greater than 60% for thicknesses of 30-75 microns and greater than 75% for thicknesses less than 50 microns. Less concentration of wavelength converting material are possible with greater optical material thicknesses. As the optical element becomes more spaced apart from the LED chip, lower concentrations may be used due to reduced flux density.

In some embodiments, the LED structure include an LED chip having a top surface and a wirebond pad on the top surface. The LED chip may be made electrically active, for example, by connecting wire bonds to pads on the LED chip. Some embodiments provide that such connections may be made before heating the LED chip and before spraying the luminescent solution onto the LED chip. Some embodiments provide that the LED structure include an LED wafer that may be singulated into multiple LED chips after spraying the luminescent solution onto the heated LED structure. In some embodiments, the LED chips may be heated and sprayed with the luminescent solution after singulation. Some embodiments provide that the luminescent solution may be atomized and sprayed to provide a spray including small and substantially consistently sized droplets.

Some embodiments include energizing the LED structure to cause the LED structure to emit light and testing the optical characteristics of the LED structure using the emitted light. In response to the optical characteristics of the LED structure not being within a predetermined binning threshold, additional luminescent solution including wavelength conversion particles suspended in a solution including a volatile solvent and a binder material onto the heated LED structure may be sprayed onto the LED structure.

Some embodiments provide that the LED structure includes an LED chip mounted in an LED package. In some embodiments, the luminescent material may be applied to the LED chip mounted in the LED package. For example, some embodiments provide that the LED package includes an optical cavity in which the LED chip may be mounted. The luminescent material may be applied to the LED chip and/or portions of the optical cavity. Some embodiments provide that the LED chip includes a top surface and a wirebond pad on the top surface. The LED may be mounted within an optical cavity of an LED package before heating the LED chip and spraying an atomized luminescent solution that includes wavelength conversion particles suspended in a solution including a solvent and/or a binder material onto the heated LED chip. Methods may further include curing the binder material via thermal energy from the heated LED chip and dispensing an encapsulant material into the optical cavity over the LED chip, thereby covering the LED chip including the wavelength conversion materials and/or the cured binder material with the encapsulant material.

In some embodiments, the LED structure includes an LED wafer. Multiple sacrificial patterns may be formed on a surface of the LED wafer and the luminescent material is applied to the sacrificial patterns and onto exposed surfaces of the LED wafer between the sacrificial patterns. Some embodiments provide that before forming the sacrificial patterns, multiple electrical contacts are formed on the surface of the LED wafer. In some embodiments, forming the sacrificial patterns includes forming at least a portion of the sacrificial patterns on the electrical contacts. Some embodiments include removing the sacrificial patterns and the portion of the sprayed luminescent solution on the sacrificial patterns to expose the electrical contacts.

Some embodiments provide that the LED structure is heated to greater than 70 degrees Celsius. Some embodiments provide that the LED structure is heated to greater than 90 degrees Celsius. Some embodiments provide that the LED structure is heated to greater than 120 degrees Celsius. In some embodiments, the LED structure is heated to a temperature in a range of about 70 degrees Celsius to about 155 degrees Celsius. In some embodiments, the LED structure is heated to a temperature in a range of about 90 degrees Celsius to about 155 degrees Celsius. In some embodiments, the LED structure is heated to a temperature in a range of about 90 degrees Celsius to about 120 degrees Celsius. Some embodiments provide that heat is applied to the LED structure before applying the luminescent material onto the heated LED structure. In some embodiments, heat is applied to the LED structure while applying the luminescent material onto the heated LED structure. Some embodiments provide that heat is applied to the LED structure after applying the luminescent material onto the heated LED structure.

Some embodiments provide that applying the luminescent material onto the heated LED structure includes spraying a first layer of the luminescent material onto the heated LED structure and then spraying a second layer of the luminescent material onto the first layer of the luminescent material. In some embodiments, the first layer of the luminescent material is cured before spraying the second layer of the luminescent material. Some embodiments provide that the luminescent material includes a first luminescent material that is sprayed in the first layer and a second luminescent material that is sprayed in the second layer and the first luminescent material is different from the second luminescent material.

In some embodiments, spraying the luminescent material onto the heated LED structure includes spraying the luminescent material onto the heated LED structure using multiple spray heads positioned to spray towards the heated LED structure at multiple angles relative to a surface of the heated LED structure.

Some embodiments of the present invention include a light emitting structure that includes a semiconductor light emitting diode (LED). The light emitting structure includes a conformal layer directly on the LED. The conformal layer includes phosphor particles and a binder material that is cured by heat energy in the LED at the time the conformal layer is applied to the LED.

Some embodiments provide that the conformal layer includes an atomized luminescent solution including the phosphor particles, a solvent and the binder layer and that the atomized luminescent solution is sprayed directly on the LED that is heated to cause the atomized luminescent solution to cure via the heat energy of the LED.

In some embodiments, the conformal layer includes a first conformal layer that is directly on the LED and a second conformal layer that is on the first conformal layer. The first conformal layer includes first phosphor particles and the second conformal layer includes second phosphor particles. In some embodiments, the first phosphor particles are configured to emit light at a first dominant wavelength and the second phosphor particles are configured to emit light at a second dominant wavelength. Some embodiments provide that the first dominant wavelength is the same as the second dominant wavelength. In some embodiments, the first dominant wavelength is different from the second dominant wavelength. Some embodiments include a third conformal layer including light diffuser particles on the third layer.

In some embodiments, the semiconductor light emitting diode includes an LED chip.

Some embodiments of the present invention include methods of forming a semiconductor light emitting device that include heating a light emitting diode (LED) structure and atomizing a luminescent material including an optical material suspended in a solution using a flow of pressurized gas. Methods include spraying the luminescent material onto the heated LED structure using the flow of pressurized gas to provide a first conformal layer of optical material that is cured via thermal energy of the heated LED structure and testing a light emission characteristic of the LED structure. Some embodiments provide that in response to the light emission characteristic of the LED structure not being acceptable, applying a second conformal layer of optical material on the LED structure and/or additional applications of the same and/or different phosphors and/or luminescent material or other optical materials such as, for example, scattering particles. Some embodiments include, before testing the light emission characteristic, allowing the heated LED structure to cool and heating the LED structure before applying the second conformal layer.

In some embodiments, the first conformal layer of optical material includes a first phosphor particle that is configured to emit light having a first wavelength in response to light emitted by the LED structure and the second conformal layer of optical material includes a second phosphor particle that is configured to emit light having a second wavelength that is different from the first wavelength, in response to light emitted by the LED structure.

Some embodiments of the present invention include deposition systems that include a liquid supply line, a reservoir coupled to the liquid supply line and configured to supply a liquid solvent containing particles of optical material to the liquid supply line and a spray nozzle coupled to the liquid supply line and configured to receive the liquid solvent from the liquid supply line. Systems may include a gas line coupled to the spray head and configured to provide a pressurized gas to the spray nozzle, a controller configured to control a flow of the liquid solvent into the spray nozzle and a heating device configured to heat a light emitting diode (LED) structure before the liquid solvent is sprayed onto the LED structure.

Some embodiments may include a mass flow controller configured to control a second flow of the liquid solvent from the reservoir into the supply line, wherein the controller is further configured to control the mass flow controller. An optical sensor may be configured to detect light output by the LED structure. In some embodiments, the controller is configured to control the flow of the liquid solvent into the spray nozzle in response to the detected light output.

BRIEF DESCRIPTION OF THE DRAWINGS

The accompanying drawings, which are included to provide a further understanding of the invention and are incorporated in and constitute a part of this application, illustrate certain embodiment(s) of the invention.

DETAILED DESCRIPTION

Figure 1:
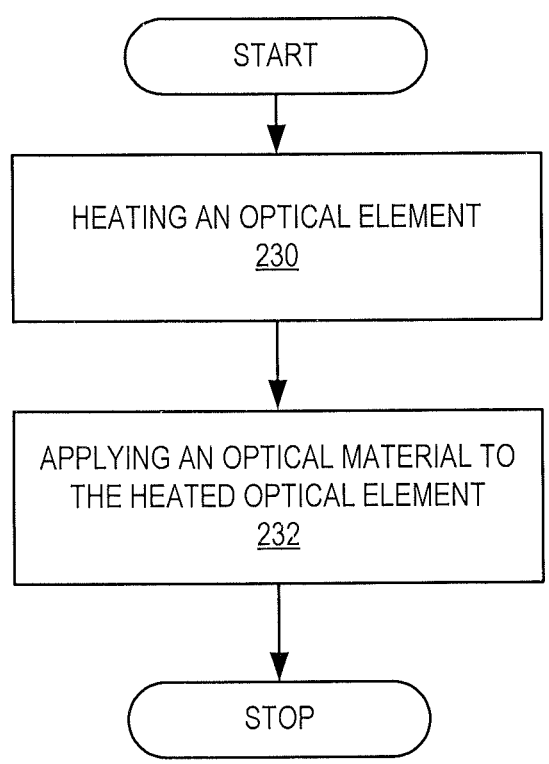
FIG. 1 is a flowchart illustrating operations for applying a conformal layer of optical materials on a LED structure, according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Some embodiments of the present invention relate to application of an optical material to an optical element, and exposing the optical material to a curing agent during the application. The curing agent may include heat, radiation, a material on or in the optical element, or other agents that speed up the curing process for the optical materials. Optical materials may include wavelength converting materials, luminescent materials, scattering particles, and light filters, among others. Particles as discussed herein may include small and/or large diameter particles. For example, some embodiments provide that small particles can be about 5 microns or less mean diameter particle size and can include nanoparticles. Large diameter particles can include about 15 microns or greater mean diameter size, such as, for example, 17 microns or greater.

Reference is now made to FIG. 1, which is a flow diagram illustrating operations for applying a conformal layer of optical materials on an optical element, according to some embodiments of the present invention. The optical element may include an LED structure such as, for example, an LED chip, device and/or wafer of multiple LED chips, among others. In some embodiments, the optical element or device may include a light transmissive, reflective, and/or support structure, among others. For example, the optical element or device may include planar, non-planar, two-dimensional, three-dimensional, lenses, reflectors, emitter packages, primary and/or secondary optics, among others. Some embodiments provide that the optical element or device may include a transparent carrier on which optical materials are applied such as, for example, phosphor material to provide a luminescent effect that is remote from the light emitting structure. The optical element is heated by a heating device (block 230). The heating device may include electrical resistive and/or inductive heating components and/or combustion related heating components. Some embodiments provide that the optical element is heated and then subsequently processed after a heating operation. The heating device may be configured to provide heat throughout the subsequently described operations. In some embodiments, a first heating device may provide an initial heating of the optical element and then a second heating device may provide a maintenance heating operation. In some embodiments, the optical element may be heated to a temperature in a range of about 90 degrees Celsius to about 155 degrees Celsius.

An optical material is applied to the heated optical element (block 232). Some embodiments provide that a luminescent solution comprising an optical material that is suspended in a solution may be atomized using a flow of pressurized gas. The atomized luminescent solution may be sprayed onto the heated LED structure using the flow of pressurized gas. The optical material may be sprayed using an air pressurized spray system.

The optical material may include wavelength conversion particles suspended in a solution including a volatile solvent and a binder material. Some embodiments provide that the volatile liquid is evaporated via thermal energy in the heated optical element. In this manner a conformal layer of wavelength conversion particles may be provided on the optical element. Some embodiments provide that the solution includes a nonvolatile liquid. In such embodiments, the nonvolatile liquid may be cured via the thermal energy in the heated optical element.

The optical element may include an LED chip having a top surface with a wirebond pad on the top surface. A wire may be bonded to the wirebond pad before heating the LED chip and before spraying the luminescent solution onto the LED chip. Some embodiments provide that the optical element includes an LED wafer and that the wafer is singulated into multiple LED chips after providing the conformal layer.

In spraying large areas, such as, for example, an LED wafer, the speed and height of the nozzle 50 (FIG. 2A) may be adjusted to achieve uniform coverage over such areas. Some embodiments provide that an acceleration of the nozzle 50 (FIG. 2A) may be used prior to the application of the optical materials to provide uniformity of the conformal layer. In some embodiments, the optical materials may be applied to multiple LED wafers in the same operation(s) to further improve uniformity and to reduce waste of the optical materials during the acceleration portion. Additionally, by varying process temperatures, a flow time after application may be controlled to achieve desired coverage.

In some embodiments, multiple conformal layers of optical materials having the same and/or different optical materials may be applied. Since each conformal layer may rapidly cure once it is deposited on the heated LED structure, subsequent layers may be applied directly thereafter. However, some embodiments provide that the LED structure may be allowed to cool between layers and then heated again for subsequently applied conformal layers.

The atomized luminescent solution may be applied at different and/or multiple angles, directions and/or orientations to affect uniformity of the conformal layer.

Referring now to FIGS. 2A-2L, application of optical materials to LED structures is illustrated. In the embodiments of FIGS. 2A-2L, the optical materials 54 are applied to an LED chip or die 70 mounted on a substrate 60. However, as explained above, optical materials 54 may be applied in a similar manner to bare (i.e. unmounted) LED die and/or to LED wafers. Accordingly, in some embodiments, optical materials 54 may be applied to the lens 94 and/or the reflector cup 62. An LED wafer includes a wafer substrate on which thin epitaxial layers forming an LED active layer have been formed and/or mounted. Accordingly, an LED wafer can include a growth substrate on which the epitaxial layers have been grown and/or a carrier substrate to which the epitaxial layers have been transferred.

Figure 2A:
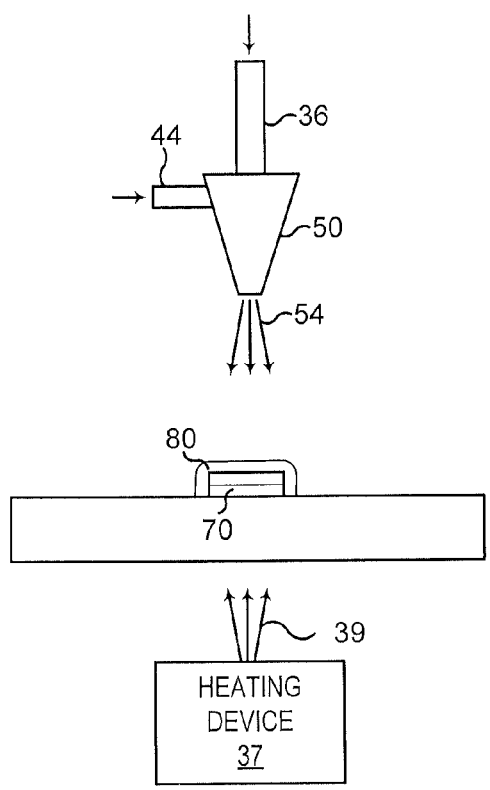
FIGS. 2A-2L illustrate the application of optical materials to a mounted LED chip according to some embodiments.
Figure 2B:
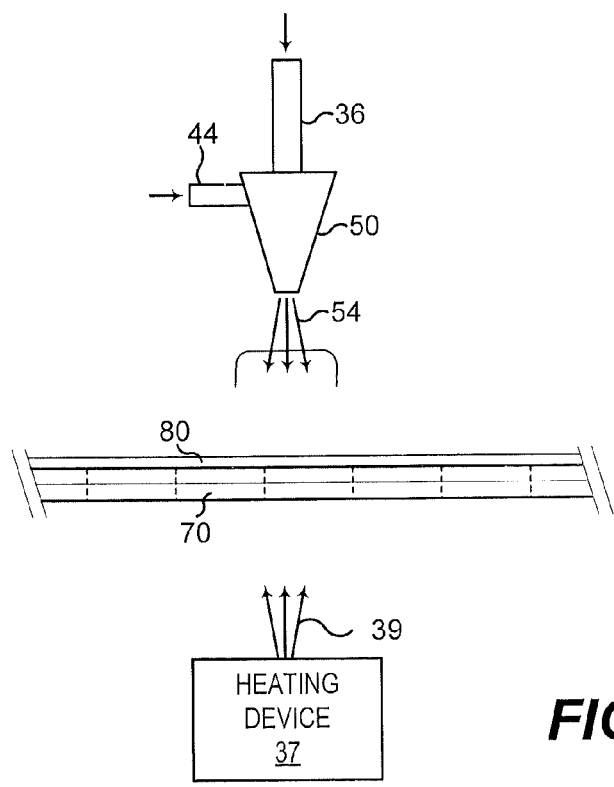

Referring to FIG. 2A, heating device 37 may provide heat to an LED chip 70. Some embodiments provide that a nozzle 50 is configured to spray the optical materials 54 onto the heated LED chip 70 to provide conformal layer 80. Similarly, referring to FIG. 2B, a wafer of LED chips 70 may be heated and the optical materials 54 may be applied thereon to provide a conformal layer 80. The LED chips 70 may be singulated after the optical materials are applied.

Figure 2C:
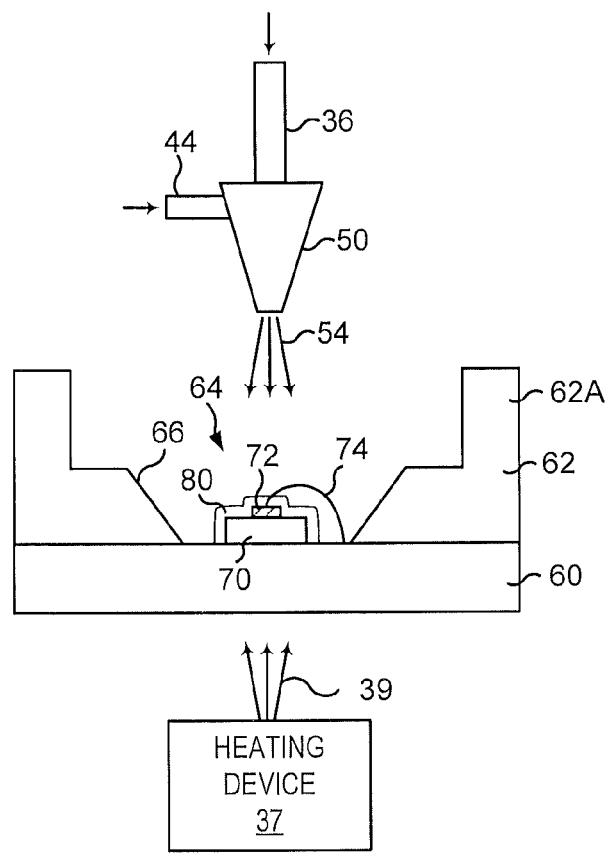
Figure 2D:
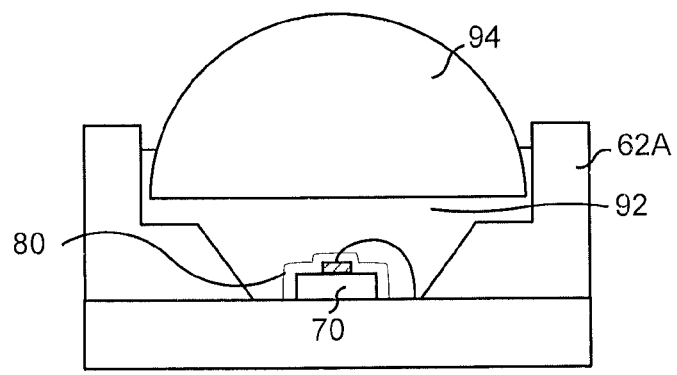

As shown in FIG. 2C, an LED chip 70 is mounted on a substrate 60. The LED chip 70 can be mounted on the substrate 60 through an intermediary structure, such as a bonding pad and/or submount (not shown). In some embodiments, the LED chip 70 can be mounted in an optical cavity 64 defined by a reflector cup 62 that is placed on the substrate 60. The reflector cup 62 includes an angled reflective surface 66 facing the LED chip 70 and configured to reflect light emitted by the LED chip 70 away from the optical cavity 64. The reflector cup 62 further includes upwardly extending sidewalls 62A that define a channel for receiving and holding a lens 94 (FIG. 2D).

It will be appreciated that the reflector cup 62 is optional. For example, the LED chip 70 could be mounted on a substrate 60, printed circuit board or other support member without any reflector around the LED chip 70. Moreover, the reflector cup 62 and the substrate 60 could be merged together as a unitary structure. The substrate 60 could also include a leadframe, and a package body may be formed on the leadframe surrounding the LED chip 70 and defining the optical cavity 64. Accordingly, the LED chip 70 could be mounted in many different styles of packaging, and the present invention is not limited to the particular packaging configuration shown in the figures.

Still referring to FIG. 2C, the LED chip 70 can include a wirebond pad 72, and a wirebond connection 74 can be formed from the wirebond pad 72 to a corresponding contact pad (not shown) on the substrate 60 or elsewhere. However, it will be appreciated that the LED chip 70 could be a horizontal LED chip having both anode and cathode contacts on the same side of the chip, and could be mounted in flip-chip fashion on the substrate 60, so that no bond wire connections may be made to the LED chip in some embodiments.

Figure 5:
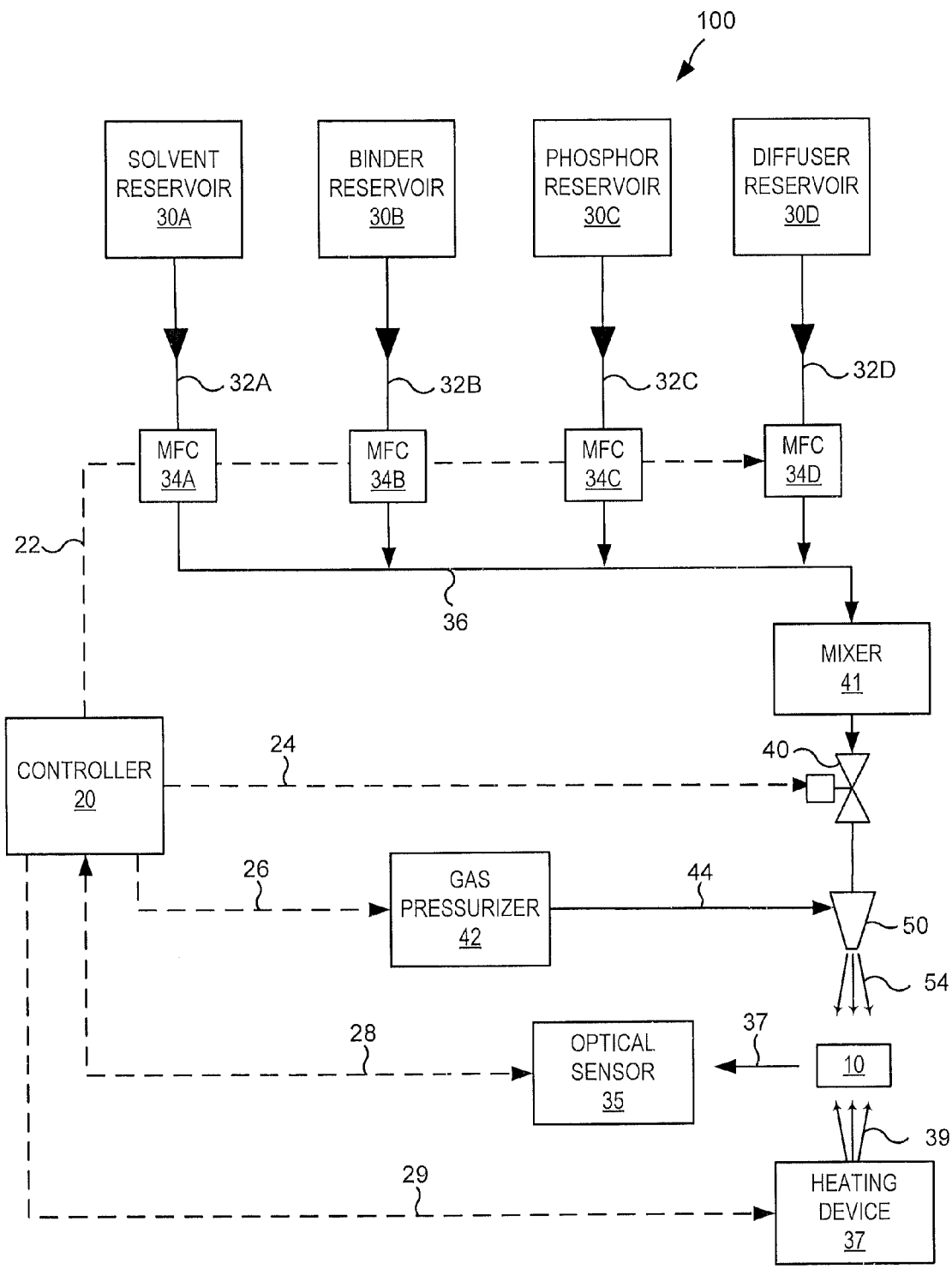
FIG. 5 is a schematic diagram illustrating a pressurized deposition system for coating an optical element and/or substrate with optical materials, according to some embodiments of the invention.
Figure 6:
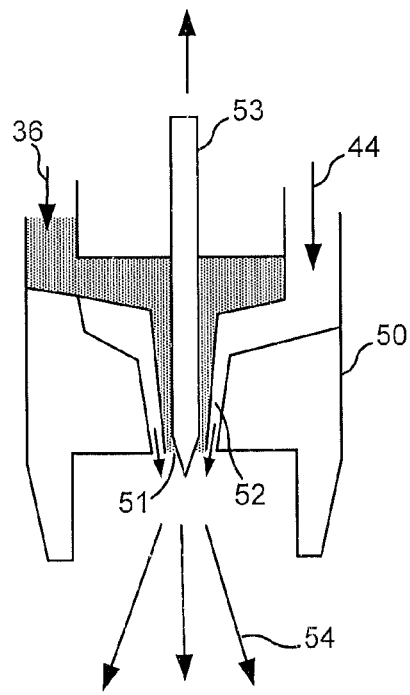
FIG. 6 illustrates a spray nozzle according to embodiments of the invention.

Referring to FIGS. 5, 6 and 2C, the controller 20 of the pressurized deposition system 100 can cause the liquid in the supply line 36 to be supplied to the spray nozzle 50. For example, the controller 20 can open the MFCs 34A, 34B and 34C and the valve 40 and close the MFC 34D. A desired concentration of optical materials 54, such as phosphor particles and/or diffuser particles can be provided into the supply line 36 by controlling the MFCs 34C, 34D. Any remaining materials in the supply line 36 left from prior applications of materials can be purged prior to deposition of the solvent, binder and phosphor material.

The heating device 37 may apply heat 39 to increase the temperature of the LED chip 70, the substrate 60, the reflector cup 62 and the wirebond pad 72. The liquid in the supply line 36 is sprayed onto the LED chip 70, forming a thin layer of the atomized binder, solvent and phosphor material (conformal layer) 80 thereon. The thermal energy from the heated LED chip 70 and substrate 60 may cause the applied binder, solvent and phosphor to cure rapidly. In some embodiments, the rapid curing may be referred to as snap-curing. By snap-curing the applied binder, solvent and phosphor, a substantially uniform and conformal layer of phosphor may be provided on the LED chip 70 and the substrate 60. As noted above, the liquid binder material can include a material such as silicone and/or epoxy. Some embodiments provide that the liquid solvent may include a volatile liquid solvent, such as alcohol and/or any of the volatile solvents listed above.

Via the thermal energy of the heated substrate 60 and LED chip 70, the volatile solvent liquid may then be evaporated off, leaving the optical materials (e.g., phosphor particles and/or diffuser particles) in the binder material to provide the conformal layer 80. However, in some cases, a non-volatile liquid, such as silicone and/or epoxy resin, may be used as a carrier liquid for the phosphor/diffuser particles, in which case the non-volatile liquid may be cured by the thermal energy of the heated substrate 60 and LED chip 70 to provide a conformal layer 80 of optical material over the LED chip 70.

Referring to FIG. 2D, after spray-coating the LED chip 70 with the conformal layer 80 of binder and phosphor material, an encapsulant material 92, such as silicone and/or epoxy, can be dispensed to at least partially fill the optical cavity 64, and a lens 94, such as a glass or silicone lens, can be positioned over the LED chip 70. Curing the encapsulant material 92 secures the lens 94 to the structure, while the vertical wall portions 62A of the reflector cup 62 allow the lens to travel as the encapsulant material 92 expands and contracts with heating/cooling cycles.

In some embodiments, spray-coating of the conformal layers 80 on the heated LED chip 70 and substrate 60 can be performed multiple times using the same and/or different optical materials. For example, referring to FIGS. 3A and 3B, a layer 80A including a first phosphor may be coated onto an LED chip 70 on a submount 60. A layer 80B of the same or of another optical material, such as phosphor particles and/or diffuser particles, can be formed on the layer 80A in the manner described above. Other layers of the same and/or of another optical materials, such as phosphor particles and/or diffuser particles, can be successively formed on the layer 80B in the manner described above. FIG. 3B further illustrates that application of the conformal layer(s) 80 may be particularly beneficial when the LED chip includes non-planar surfaces, such as, for example, bevels, among others. The thermal energy from the heated LED chip 70 and substrate 60 may cause the applied binder, solvent and phosphor to cure rapidly. In some embodiments, the rapid curing may be referred to as snap-curing. By snap-curing the applied binder, solvent and phosphor, a substantially uniform and conformal layer of phosphor may be provided on the LED chip 70 and the substrate 60.

Figure 2E:
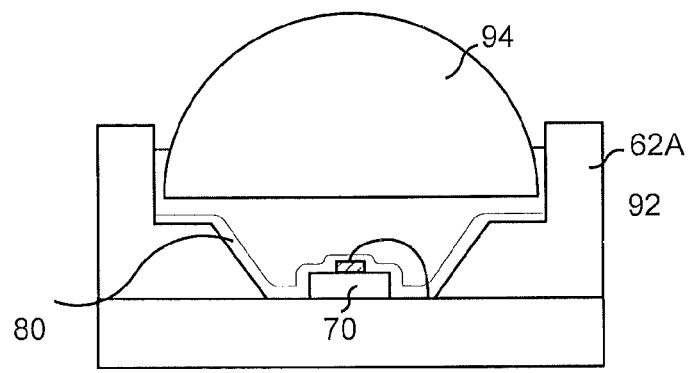
Figure 2F:
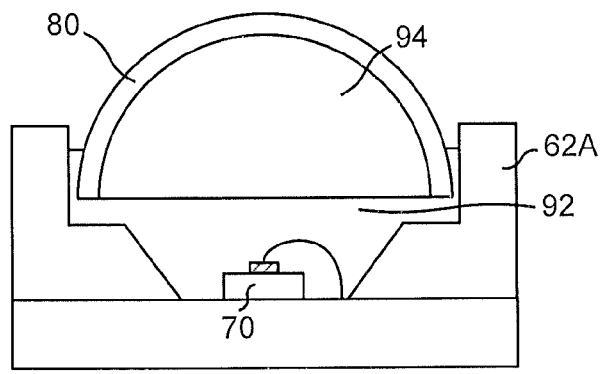
Figure 2G:
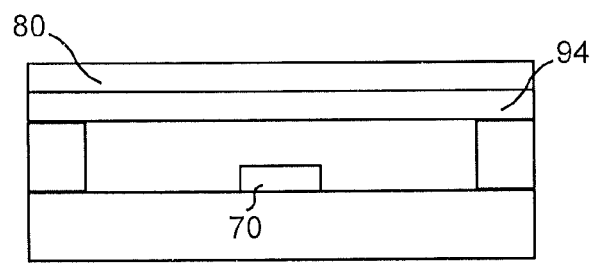
Figure 2H:
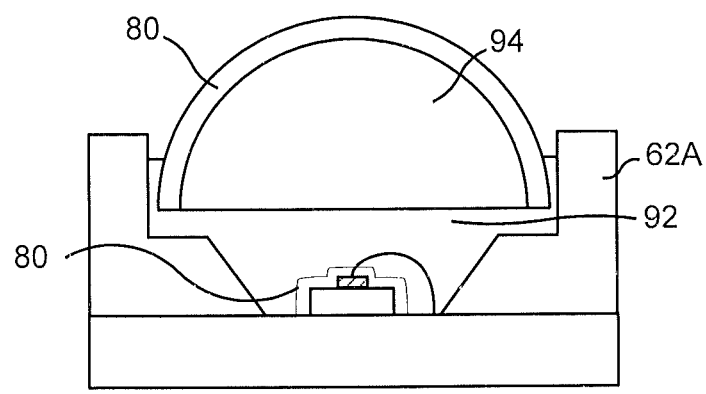

Referring to FIG. 2E, some embodiments provide that the liquid in the supply line 36 is sprayed onto the LED chip 70 and the surrounding structure, such as, for example, the reflector cup 62 thus forming a conformal layer 80 thereon. Additionally, referring to FIG. 2F, in some embodiments, the conformal layer 80 may be formed on an exterior and/or interior surface of a lens 94, which is heated to cause the conformal layer 80 to cure when applied thereto. Reference is made to FIG. 2G, which illustrates that the conformal layer 80 may be applied to a two-dimensional structure, such as, for example, a lens 94 or other transmissive and/or reflective optical element. Brief reference is made to FIG. 2H, which illustrates that the conformal layer 80 may be applied to a heated lens 94 and the heated LED chip 70.

Figure 2I:
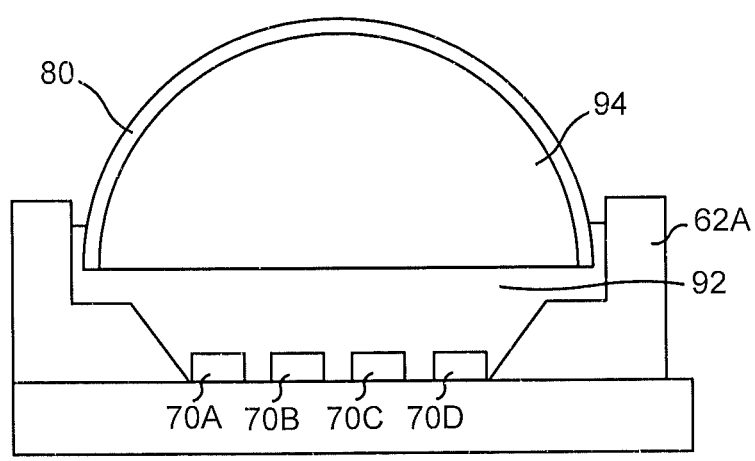
Figure 2J:
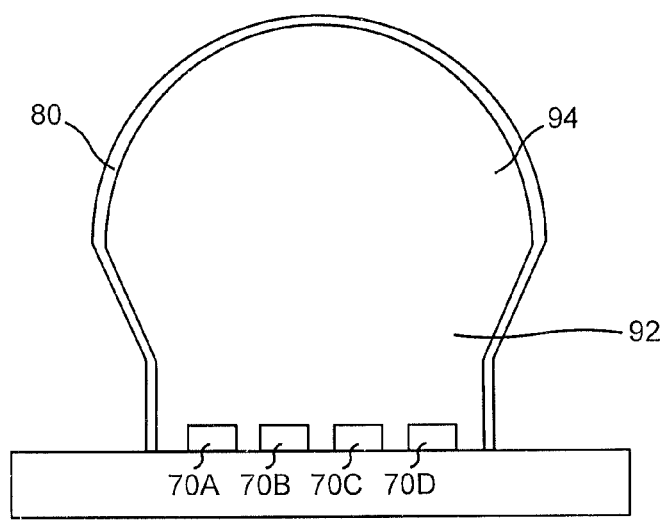
Figure 2K:
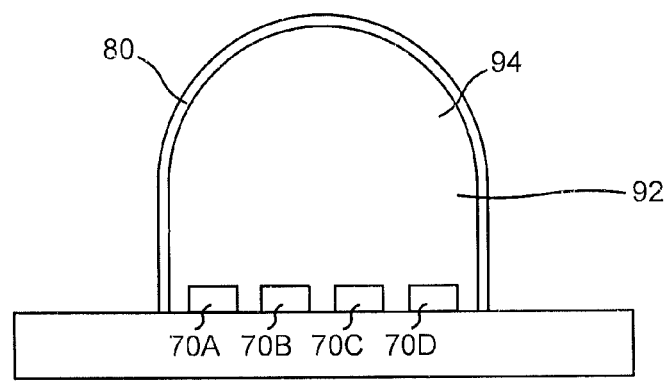
Figure 2L:
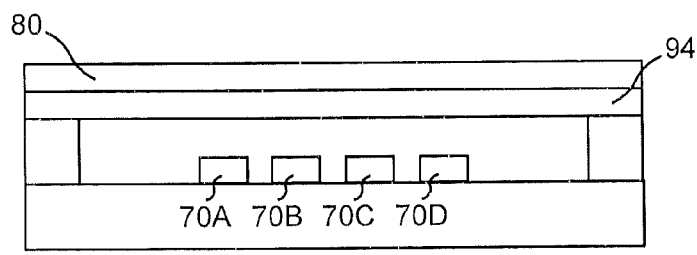

Reference is made to FIG. 2I, which illustrates multiple LED chips 70A-D that are electrically connected on a bottom of the LED chip. For example, the LED chips 70A-D may include flip-chips having no wire bond for electrical termination. The LED chips 70A-D may be configured to emit light at one or more different dominant wavelengths and/or combinations thereof. A conformal coating 80 may be provided on the outside and or inside of a lens 94. FIGS. 2J, 2K and 2L illustrate multiple non-wire bonded LED chips 70A-D configured inside a lens 94 that includes a conformal layer 80 as described herein. Some embodiments provide that conformal coating may be applied to one or more of the multiple LED chips 70A-D in addition to or in alternative to the lens 94. In some embodiments, the LED chips could be wirebonded.

A conformal layer 80 applied to a lens 94 may be performed after during and/or before assembly with the LED chips 70A-D. For example, some embodiments provide that an array of multiple lenses may be heated and then the optical materials applied thereto. Similarly, micro molds could be sprayed to form optical material elements that may be removed from the mold and placed over an optical element, such as an LED chip.

Figure 3A:
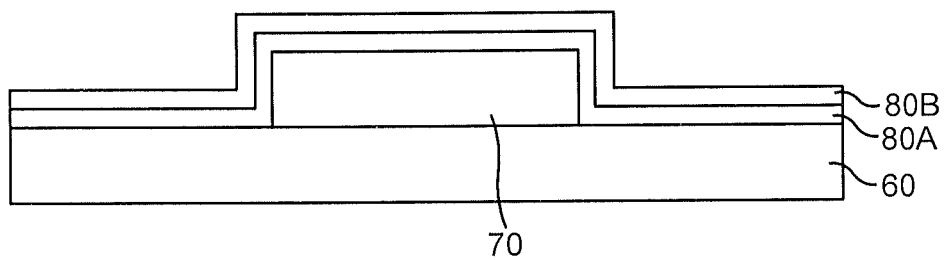
FIGS. 3A and 3B illustrate the application of optical materials to different respective LED chips according to some embodiments.
Figure 3B:
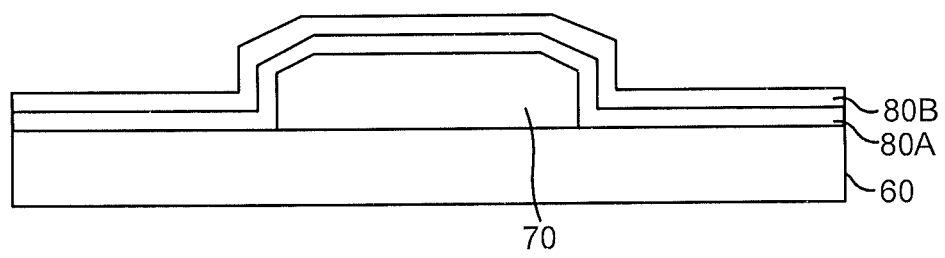

FIGS. 3A and 3B show an LED chip 60 mounted to a submount or substrate 60 with different layers 80A and 80B of optical materials. Additional or intervening layers are possible. The different layers 80A and 80B of optical materials can include the same or different optical materials. For example, the layers 80A and 80B of optical material can include a first and second types of phosphor particles. In some embodiments, phosphor particles having different sizes can be in the different layers. Some embodiments provide that additional layers of optical material can include other phosphor particles and/or diffuser particles, among others.

In some embodiments, the layer 80A of optical material can include phosphor particles configured to convert incident light to a first wavelength (e.g. yellow), while the layer 80B of optical material can include phosphor particles configured to convert incident light to a second wavelength, different from the first wavelength (e.g. red). Accordingly, light output by the packaged LED chip 70 can be a mixture of primary light emitted by the LED chip 70 and secondary light emitted by the layer 80A of phosphor and the layer 80B of phosphor. Such light can have improved color rendering properties compared to light generated using only one kind of phosphor.

Figure 4:
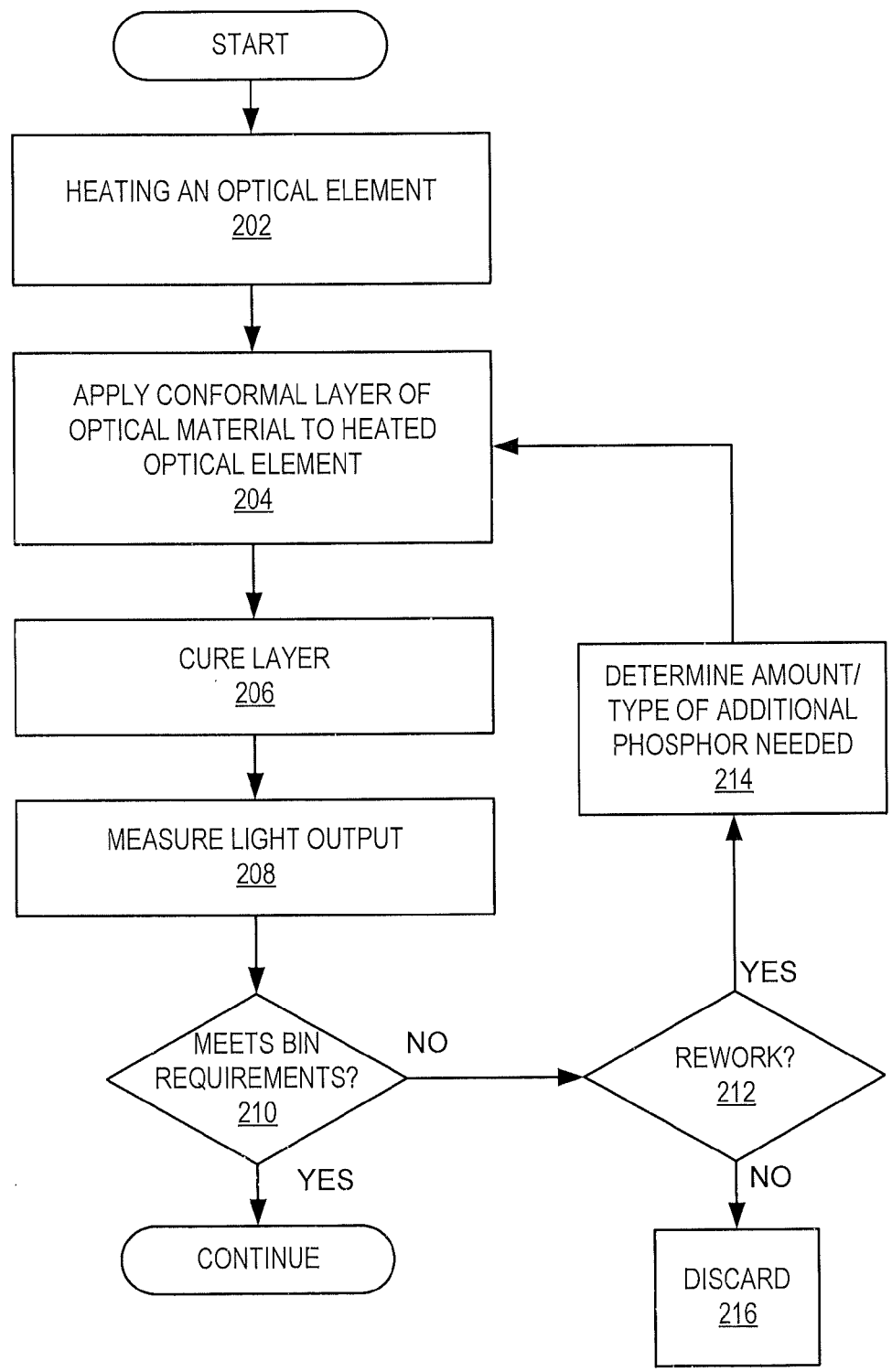
FIG. 4 is a flowchart illustrating operations according to some embodiments of the invention.

In some embodiments, the layer 80A of optical material and the layer 80B of optical material can include the same type of phosphor. For example, referring to FIGS. 3, 4 and 5, an optical element, for example, an LED structure, such as an LED chip 70, may be heated (block 202). Some embodiments provide that the optical element may include substrates and/or optical devices. A conformal layer 80A of optical material may be applied to a heated optical element using a spray deposition system 100 according to embodiments of the invention (block 204). The solvent can then be rapidly evaporated and/or cured, depending on whether the solvent is volatile or non-volatile, by virtue of the thermal energy in the heated optical element so that the binder material can be cured to adhere the optical materials (e.g., phosphor particles, etc.) to the optical element (e.g., LED chip 70, etc.) (block 206). Some embodiments provide that the optical element could then be stored, e.g. at room temperature, to be later retrieved for further tuning.

The optical element can then be energized, for example, by applying a voltage across anode and cathode terminals of an emitting portion, and the optical characteristics (e.g., power output, color point, CCT) of the device including the conformal layer 80A can be measured. In particular, the output power (brightness), color point and/or correlated color temperature (CCT) of the LED structure can be measured (block 208). For example, the light output by the LED structure can be measured by an optical sensor 35, and the results can be provided to the controller 20. Testing the optical element may be easiest as an LED structure including a mounted LED chip. When an LED structure includes an LED wafer, it may be possible to test representative areas/devices on the wafer instead of testing every device on the wafer, and tune the entire wafer based on the light output from the test locations.

A test is then performed to determine if the optical characteristics of the wafer are acceptable, i.e. to see if the wafer meets established binning requirements (block 210). If the optical characteristics of the structure are unacceptable, a decision is made at block 212 whether to discard the device (block 216) or rework the device. However, if the optical characteristics are satisfactory, the manufacturing process proceeds to the next manufacturing step.

If it is determined that the device can be reworked, the light output corresponding to the optical element can be tuned by determining the amount and type of additional phosphor needed to correct the color point/CCT of the structure (block 214). A second conformal layer 80B can be applied (block 202). In some embodiments, the test may be performed while the optical element is still heated. Some embodiments provide that the optical element is reheated for applying the second conformal layer 80B. The second conformal layer 80B may include the same and/or different type from the phosphor used in the first conformal layer 80A and can be applied using the spray deposition system 100 under the direction of the controller 20.

In general, the operations of blocks 202-214 can be repeated as desired to achieve the desired optical characteristics, as illustrated in conformal layers 80C and 80D. However, if too much phosphor is applied, the light emission characteristics may deteriorate due to reabsorption and/or excessive absorption of light from the optical element, at which point the optical element may fail the test at block 210.

FIG. 5 is a schematic diagram illustrating a pressurized deposition system 100 for coating an optical element 10 with optical materials 54, such as luminescent particles and/or diffuser particles. In some embodiments, the optical element 10 may include a light emitting structure, such as, for example, a light emitting diode (LED), whereas some embodiments provide that the optical element 10 includes a light transmissive, reflective, and/or support structure, among others. For example, the optical element 10 may include planar, non-planar, two-dimensional, three-dimensional, lenses, reflectors, emitter packages, primary and/or secondary optics, among others. Some embodiments provide that the optical element 10 may include a transparent carrier on which optical materials 54 are applied such as, for example, phosphor material to provide a luminescent effect that is remote from the light emitting structure.

According to some embodiments, the optical materials 54 are sprayed onto the optical element 10 by the system 100. Some embodiments provide that the optical materials 54 are applied using application techniques such as pouring, dipping, rolling, brushing and/or stamping, among others. A heating device 37 applies heat (thermal energy) 39 to the optical element 10 to increase the temperature of the optical element 10 prior to spraying the optical materials 54 thereon. As shown in FIG. 1, a supply line 36 supplies a carrier liquid containing the optical materials 54 to a spray nozzle 50. The carrier liquid is sprayed onto an optical element 10 via the spray nozzle 50. In particular, pressurized gas supplied to the spray nozzle 50 through a high pressure gas supply line 44 atomizes the carrier liquid and directs the optical materials 54 towards the optical element 10 where the optical materials 54 are deposited, as described in more detail below. Some embodiments provide that the optical materials 54 are an atomized liquid. The term "atomize" is used herein in a general sense to refer to reducing a liquid to minute particles and/or to a fine spray. A conformal layer including the optical materials 54 may be provided from a rapid curing of the atomized liquid when deposited on the heated optical element 10. For example, the curing time of optical materials 54 applied to a heated optical element 10 may be substantially shorter than that of optical materials 54 applied to a non-heated optical element. In this manner, settling, separation and/or stratification of the optical materials 54 may be significantly reduced or eliminated. Accordingly, better layer bonding and more uniformity in layer thickness and composition may be achieved.

The optical element 10 can include an LED wafer, a mounted LED die and/or an unmounted (i.e. bare) LED die. In some embodiments, the LED structure may include a light transmission and/or reflection element that is configured to transmit and/or reflect light received from an emitter. In such embodiments, the light transmission and/or reflection element may be configured to be heated and then have the optical materials 54 deposited thereon. The light transmission and/or reflection elements may be planar (2-dimensional) and/or 3-dimensional. Some embodiments provide that in order to receive light, the light transmission and/or reflection element may be in contact with, proximate to, and/or spaced apart from the LED die. Accordingly, systems and methods according to embodiments of the invention can be used at various stages of a manufacturing process.

In some embodiments, the liquid in the supply line 36 may include a binder that includes organic and/or organic-inorganic hybrid materials. Some embodiments provide that the liquid in the supply line 36 can include, for example, a binder material, such as liquid silicone and/or liquid epoxy, and/or a volatile or nonvolatile solvent material, such as alcohol, water, acetone, methanol, ethanol, ketone, isopropynol, hydrocarbon solvents, hexane, ethylene glycol, methyl ethyl ketone, xylene, toluene, and combinations thereof. In some embodiments, the binder may have an index of refraction of greater than about 1.25. Some embodiments provide that that the index of refraction of a binder material may be greater than about 1.5. It may be desirable to have high light transmission across the visible spectrum. In some embodiments, the binder may have a transmission of light including about 90% or greater in a wavelength range including about 440 nm to about 470 nm at thicknesses as described herein. In some embodiments, the binder may have a transmission of light including about 95% or greater in a wavelength range including about 440 nm to about 470 nm at thicknesses as described herein. In some embodiments, the binder may have a transmission of light including about 98% or greater in a wavelength range including about 440 nm to about 470 nm at thicknesses as described herein. In some embodiments, the binder may have a transmission of light including about 90% or greater, about 95% or greater, and/or about 98% or greater for other wavelengths in the visible spectrum, such as green, yellow and/or red. In general, a volatile solvent dries or evaporates off shortly after being deposited. A volatile or nonvolatile solvent material can include particles therein that are to be deposited onto the LED structure, such as particles of a luminescent material (e.g. a phosphor) and/or particles of a light-scattering material, such as titanium dioxide, among others. The liquid in the supply line 36 is provided from one of a plurality of fluid reservoirs 30A to 30D, which are attached to the supply line 36 through respective input lines 32A to 32D. The flow of liquid through the input lines 32A to 32D can be carefully controlled by electronically-controlled mass flow controllers 34A to 34D, respectively.

As shown in FIG. 5, the reservoirs 30A to 30D can include a solvent reservoir 30A that contains a volatile liquid solvent, such as alcohol, water, etc., and a binder reservoir 30B that contains a liquid binder material, such as liquid silicone and/ or liquid epoxy. In some embodiments, the solvent reservoir 30A and the binder reservoir 30B can include "pure" liquids, that is, liquids that do not contain any phosphor, diffuser, or other particles therein. The reservoirs 30A to 30D can also include a phosphor reservoir 30C that contains a liquid solvent in which a concentration of phosphor particles is suspended. In some embodiments, the phosphor reservoir 30C can include phosphor particles at a concentration that is greater than a concentration at which the phosphor particles will be applied onto the optical element 10.

The reservoirs 30A to 30D can also include a diffuser reservoir 30D that contains a liquid solvent in which a concentration of diffuser particles is suspended. In some embodiments, the diffuser reservoir 30D can include diffuser particles at a concentration that is greater than a concentration at which the diffuser particles will be applied onto the optical element 10.

One or more of the reservoirs 30A to 30D can be pressurized, so that flow from the reservoirs 30A to 30D can be obtained by positive pressure into the supply line 36. In particular, the solvent reservoir 30A and the binder reservoir 30B can be pressurized. In some embodiments, the phosphor reservoir 30C and/or the diffuser reservoir 30D may not be pressurized, so that flow from the phosphor reservoir 30C and/or the diffuser reservoir 30D may be induced into the supply line 36 by negative pressure caused by flow through the supply line 36. The pressure in the liquid supply line 36 need not be high, since the force for spraying the liquid onto the optical element 10 is provided by a high-pressure gas line 44.

The flow of liquid through the supply line 36 can be controlled by an electronically controllable valve 40. When the valve 40 is open, liquid in the supply line 36 is supplied to the spray nozzle 50.

FIG. 6 illustrates a spray nozzle 50 according to embodiments of the invention in greater detail. Referring to FIGS. 5 and 6, pressurized gas (e.g., pressurized air) generated by a gas pressurizer 42 may be supplied to the spray nozzle 50 through the pressurized gas supply line 44. The pressurized gas is directed to through a gas outlet port 52 in the spray nozzle 50 that is adjacent a liquid outlet port 51. The flow of liquid through the liquid outlet port 51 can be regulated, for example, by controlling the position of a retractable pin 53. When the pin 53 is retracted, the liquid outlet port 51 is opened. The flow of pressurized gas out of the gas outlet port 52 creates a negative pressure gradient relative to the liquid outlet port 51, which causes liquid dispensed from the liquid outlet port 51 to be atomized. The atomized liquid 54 is then carried by the gas flow from the gas outlet port 52 to the optical element 10, where the atomized liquid 54 flow deposits on the LED structure.

As further illustrated in FIG. 5, operations of the mass flow controllers 34A to 34D, the electronically controllable flow valve 40, and the gas pressurizer 42 can be controlled by a controller 20 via electronic control lines 22, 24, 26. The controller 20 can be a conventional programmable controller and/or can include an application specific integrated circuit (ASIC) configured to control operation of the respective elements of the system 100, or a general microprocessor or controller (e.g. computer).

Referring still to FIG. 5, by controlling the operations of the mass flow controllers (MFCs) 34A to 34D and the valve 40, the controller 20 can control the composition of liquid that is supplied to the spray nozzle 50 through the supply line 36. In particular, the controller 20 can cause the MFCs 30A, 30C and 30D to turn off, while the MFC 30B and the valve 40 are turned on, to thereby supply the binder liquid to the spray nozzle 50. Likewise, the controller 20 can cause the MFCs 30B, 30C and 30D to turn off, while the MFC 30A and the valve 40 are turned on, to thereby supply only the solvent liquid to the spray nozzle 50. With the solvent material from the solvent reservoir 30A flowing, the controller 20 can cause the MFCs 34C and/or 34D to release liquids bearing phosphor particles (in the case of the phosphor reservoir 30C) and/or diffuser particles (in the case of the diffuser reservoir 30D) into the flow in the supply line 36. Accordingly, the controller 20 can precisely control the composition of material sprayed onto the optical element 10 by the spray nozzle 50.

It will be appreciated that while FIG. 5 illustrates a single phosphor reservoir 30C and a single diffuser reservoir 30D, more reservoirs can be provided and attached to the supply line through respective MFCs and/or supply valves that can be electronically controlled by the controller 20. For example, separate phosphor reservoirs can be provided for red phosphors, green phosphors, yellow phosphors, blue phosphors, etc., depending on the product requirements. Some embodiments provide that more than one color of phosphor may be applied to an optical element 10 in respectively separate regions and/or mixed to form a single layer. Furthermore, more than one type of diffuser particle can be selectively provided using different diffuser reservoirs. For example, it may be desirable to apply diffuser particles having a first composition and/or diameter on one part of an optical element 10 and diffuser particles having a different composition and/or diameter on another part of the optical element 10. It may be desirable to apply more than one phosphor (e.g., different colors) in discrete areas of the LED structure. It may also be desirable to mix differently colored phosphors in a single layer, region and/or area of the LED structure (similar to FIG. 3, except different colored phosphors are within a single layer). In such cases, there may be at least two different phosphors applied at the same time, either from separate reservoirs or a single reservoir that contains multiple phosphors.

As illustrated, the heating device 37 applies heat 39 to the optical element 10 to increase the temperature of the optical element 10 prior to spraying the optical materials thereon. Some embodiments provide that the heating device may be electronically controlled by the controller 20 via electronic control line 29. In some embodiments, the heating device 37 may apply heat 39 to the optical element 10 during the spraying operation(s). In some embodiments, the heating device 37 may be used to heat the optical element 10 prior to the spraying operation(s) and/or may be operated independent of the controller 20.

Some embodiments provide that the heating device 37 includes a thermally conductive heating surface through which heat 39 is transferred to the optical element 10. In some embodiments, the heating device 37 may use a heat transfer media, such as, for example, heated air and/or gases, to transfer heat 39 to the optical element 10. Embodiments of the heating device may include electrically resistive and/or conductive and/or combustion related heat generating elements.

Some embodiments provide that the optical element 10 is heated to greater than 70 degrees Celsius. Some embodiments provide that the optical element 10 is heated to greater than 90 degrees Celsius. Some embodiments provide that the optical element 10 is heated to greater than 120 degrees Celsius. In some embodiments, the optical element 10 is heated to a temperature in a range of about 70 degrees Celsius to about 155 degrees Celsius. In some embodiments, the optical element 10 is heated to a temperature in a range of about 90 degrees Celsius to about 155 degrees Celsius. In some embodiments, the optical element 10 is heated to a temperature in a range of about 90 degrees Celsius to about 120 degrees Celsius. In some embodiments, the optical element 10 is heated to a temperature in a range of about 90 degrees Celsius to about 155 degrees Celsius. When the atomized liquid 54 is deposited on the optical element 10, the thermal energy in the heated optical element 10 rapidly cures and/or evaporates the solvent portion of the atomized liquid 54. By rapidly curing and/or evaporating the solvent, settling and/or redistribution of the optical materials prior to curing may be reduced. In this regard, a more uniform concentration of the optical materials within the applied layer may be preserved, thus providing a substantially conformal layer of optical materials on the LED structure.

It will be further appreciated that a system 100 as illustrated in FIG. 5 may be split into several parts, so that, for example, separate supply lines 36 are provided and/or separate spray nozzles 50 are provided. For example, a system could have a first supply line 36 and nozzle 50 dedicated to spray-applying an atomized liquid 54 from a first direction and/or at a first angle relative to the optical element 10 and a second supply line 36 and nozzle 50 dedicated to spray-applying an atomized liquid 54 from a second different direction and/or at a second different angle relative to the optical element 10. Some embodiments provide that the first and second supply lines 36 and nozzles 50 are configured to provide the same atomized liquids 54. In some embodiments, the first and second supply lines 36 and nozzles 50 are configured to provide different atomized liquids from one another. Accordingly, many different combinations of reservoirs, supply lines and spray nozzles are contemplated according to various embodiments.

A mixer 41 may be provided to mix supply line 36 constituents from various different ones of the reservoirs 30A-D. In some embodiments, the mixer may include a static mixing element that causes the materials in the supply line 36 to mix by virtue of the flow therethrough. Some embodiments provide that may include an active mixing element that agitates the supply line 36 materials to keep particles in suspension and/or substantially uniformly distributed throughout the materials. Although not illustrated, pressure controllers may be provided for various ones of the components. For example, the reservoirs 30A-D and the nozzles 50 may include pressure controllers to provide control over the supply and/or delivery pressures, among others. Further, some embodiments may include static and/or active mixing elements in the reservoirs 30A-D. For example, the phosphor reservoir 30C and the diffuser reservoir 30D may use mixing elements to maintain the particles in suspension.

FIG. 5 further illustrates an optical sensor 35 that is configured to sense light 37 emitted by the optical element 10. For example, the optical sensor 35 can detect a color point and/or intensity of light emitted by the optical element 10. The detected light information can be provided to the controller 30 via a communication line 28, and can be used as a feedback signal in the control of the operations of the deposition system 100, as described in more detail herein.

Figure 7:
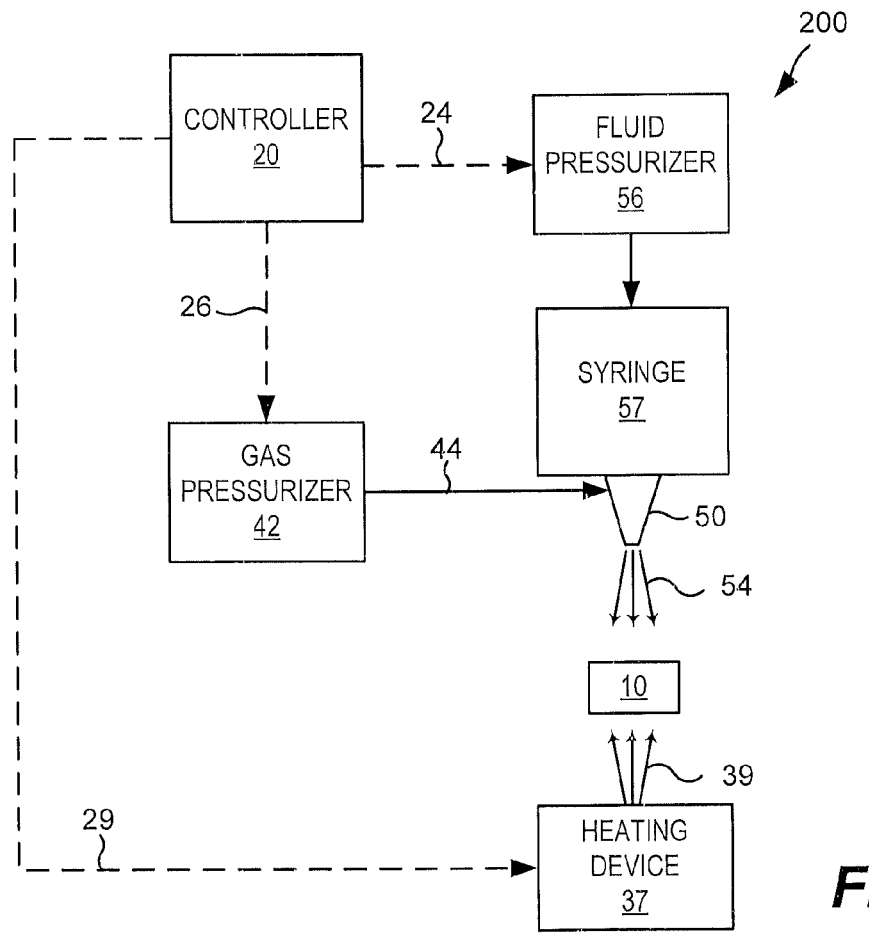
FIG. 7 is a schematic diagram illustrating a batch deposition system for coating a light emitting diode (LED) structure with optical materials, according to some embodiments of the invention.

Reference is now made to FIG. 7, which is a schematic diagram illustrating a batch deposition system 200 for coating an optical element with optical materials, according to some embodiments of the invention. As discussed above regarding FIGS. 5 and 6, pressurized gas (e.g., pressurized air) generated by a gas pressurizer 42 may be supplied to the spray nozzle 50 through the pressurized gas supply line 44. The pressurized gas is directed to through a gas outlet port 52 in the spray nozzle 50 that is adjacent a liquid outlet port 51. The flow of liquid through the liquid outlet port 51 can be regulated, for example, by controlling the position of a retractable pin 53.

A syringe 57 may include a batch of optical materials 54. The optical materials 54 may include, for example, one or more types of phosphor particles, one or more types of diffuser particles, a binder, and/or one or more solvents. The syringe 57 may be loaded with a mixture, compound, solution and/or suspension including the optical materials using for example, a cartridge that is configured to contain the optical materials 54. In this manner, a batch of optical materials 54 may be prepared shortly before the application operations to reduce settling and/or stratification of the components therein. In some embodiments, the syringe may be coupled directly and/or closely to the nozzle 50 to reduce settling of suspended particles in the optical materials 54. Some embodiments provide that lateral fluid paths may be reduced and/or avoided as such paths may result in settling and/or stratification of the optical materials 54. In some embodiments, an active and/or static mixing element is provided with and/or within the syringe 57 to reduce settling.

A fluid pressurizer 56 may be provided to provide and/or control a fluid pressure within the syringe 57. Some embodiments provide that the fluid pressure may be substantially lower than the gas pressure provided by the gas pressurizer 42.

As further illustrated in FIG. 7, operations of the gas pressurizer 42, the fluid pressurizer 56 and the heating device 37 can be controlled by a controller 20 via electronic control lines 24, 26 and 29. The controller 20 can be a conventional programmable controller and/or can include an application specific integrated circuit (ASIC) configured to control operation of the respective elements of the system 200, or a general microprocessor or controller (e.g. computer).

Referring still to FIG. 7, by controlling the operations of the fluid pressurizer 56 and the gas pressurizer 42, the controller 20 can control the flow of liquid that is supplied to the spray nozzle 50.

It will be appreciated that while FIG. 7 illustrates a single syringe 57 and nozzle 50, more syringes 57 and nozzles 50 can be provided and attached to gas pressurizer 42 and the fluid pressurizer 56. In some embodiments, additional gas pressurizers 42 and fluid pressurizers 56 may be electronically controlled by the controller 20.

As illustrated, the heating device 37 applies heat 39 to the optical element 10 to increase the temperature of the optical element 10 prior to spraying the optical materials thereon. Some embodiments provide that the heating device may be electronically controlled by the controller 20 via electronic control line 29. In some embodiments, the heating device 37 may apply heat 39 to the optical element 10 during the spraying operation(s). In some embodiments, the heating device 37 may be used to heat the optical element 10 prior to the spraying operation(s) and/or may be operated independent of the controller 20.

Some embodiments provide that the heating device 37 includes a thermally conductive heating surface through which heat 39 is transferred to the optical element 10. In some embodiments, the heating device 37 may use a heat transfer media, such as, for example, heated air and/or gases, to transfer heat 39 to the optical element 10. Embodiments of the heating device may include electrically resistive and/or conductive and/or combustion related heat generating elements.

It will be further appreciated that a system 200 as illustrated in FIG. 7 may be split into several parts, so that, for example, separate syringes 57 are provided and/or separate spray nozzles 50 are provided. Accordingly, many different combinations of syringes 57, nozzles 50, fluid pressurizers 56 and/or gas pressurizers 42 are contemplated according to various embodiments.

Figure 8A:
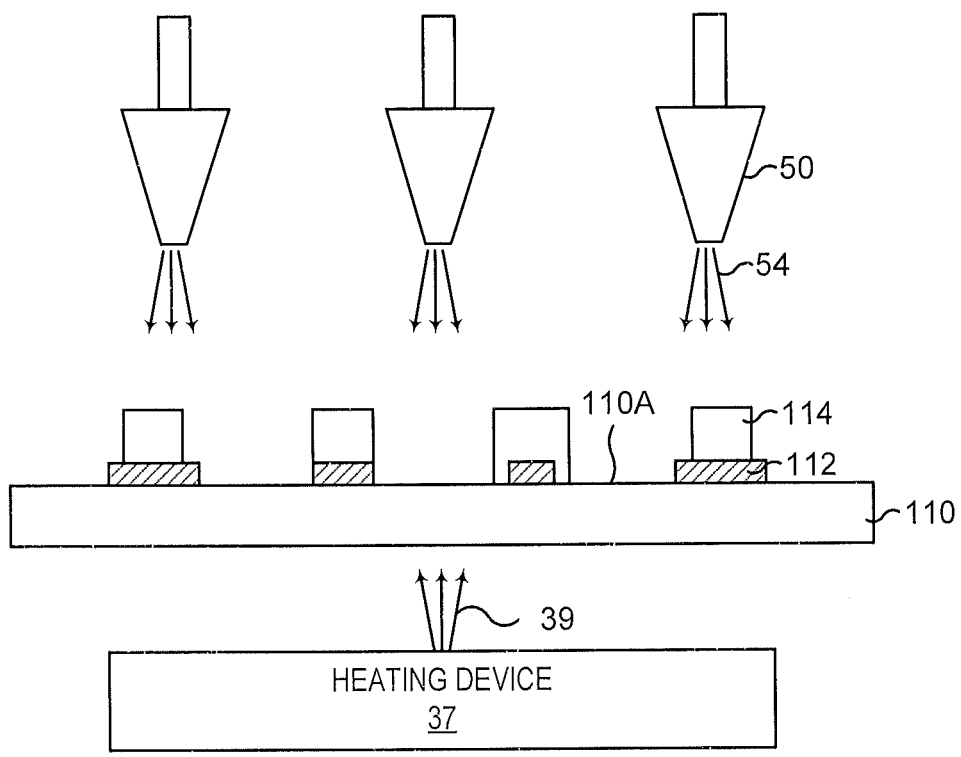
FIGS. 8A, 8B and 8C illustrate the application of optical materials to an LED wafer according to some embodiments.
Figure 8B:
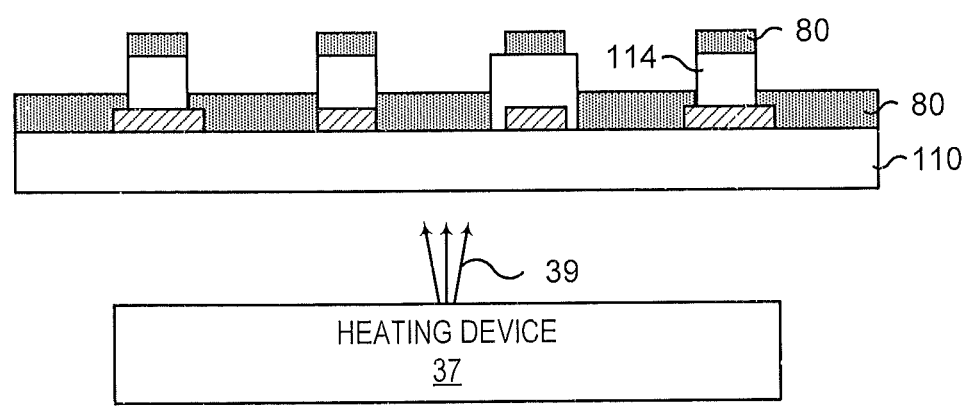
Figure 8C:
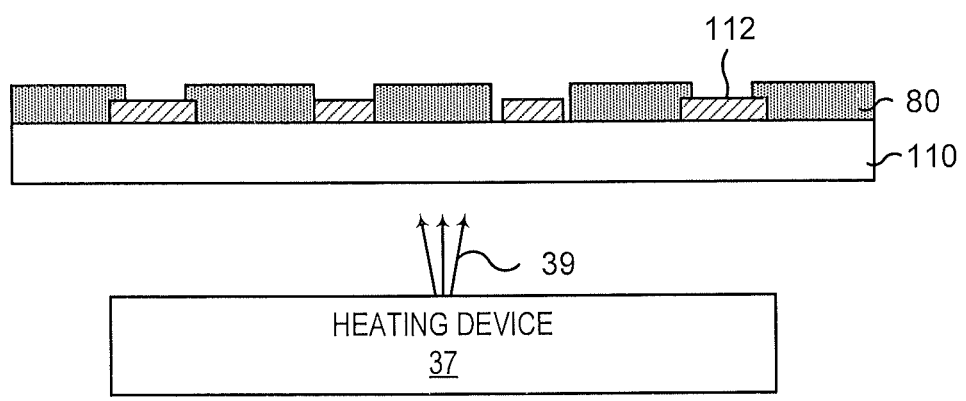

FIGS. 8A to 8C illustrate operations associated with coating an LED wafer according to some embodiments. Referring to FIG. 8A an LED wafer 110 is provided. As discussed above, an LED wafer includes a plurality of thin epitaxial layers that define a light emitting diode structure. The epitaxial layers are supported by a substrate that can include a growth substrate and/or a carrier substrate. The epitaxial region of the LED wafer 110 can be divided into a plurality of discrete device regions, for example, by mesa and/or implant isolation. In some embodiments, dicing streets (i.e. linear regions where the wafer is to be diced using a dicing saw) and/or scribe lines may already be formed in the LED wafer 110. A plurality of electrical contacts 112 are formed on the LED wafer 110. In particular, each discrete device in the LED wafer 110 can include at least one electrical contact 112 on a side of the wafer on which phosphor is to be applied.

A sacrificial pattern 114 is formed on the electrical contacts 112. The sacrificial pattern 114 can include a material such as soluble polymer and/or glass, which can be applied and patterned using conventional photolithographic techniques. The sacrificial pattern 114 can be aligned with the underlying electrical contacts 112. Alternatively, the sacrificial pattern 114 can cover only portions of the electrical contacts 112, with some portions of the electrical contacts 112 being exposed. In some embodiments, the sacrificial pattern 114 can be wider than the electrical contacts 112, so that portions of the surface 110A of the LED wafer 110 adjacent the electrical contacts are also covered by the sacrificial patterns. All three possibilities are illustrated in FIG. 8A.

Referring still to FIGS. 8A and 8B, the LED wafer 110 is heated using a heating device 37 and one or more conformal layers 80 of optical material, such as phosphor particles and/or diffuser particles, are applied to the surface 110A of the LED wafer 110 using a spray nozzle 50 of a pressurized deposition system 100 (FIGS. 1 and 2). The conformal layer 80 is coated onto the surface 110A of the LED wafer 110 and on the sacrificial pattern 114. In some embodiments, the layer 80 may also be coated onto upper portions of the electrical contacts 112 opposite the LED wafer 110.

After spray-coating the LED wafer 110, the sacrificial pattern 114 can be removed, for example, by exposure to a liquid solvent specific to the sacrificial pattern material, resulting in an LED wafer 110 as shown in FIG. 8C that includes exposed electrical contacts 112 and one or more layers 90 of optical material on the surface of the LED wafer 110. Although not specifically illustrated, some embodiments provide that the sacrificial pattern 114 may be formed using a film and/or tape that may be removed after the LED wafer is spray coated.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method, comprising:
   heating an optical element that includes at least one non-planar surface; and
   after heating the optical element, applying an optical material to at least one non-planar surface on the heated optical element,
   wherein heating the optical element comprises heating a plurality of LED chips arranged on a common surface.

2. The method of claim 1, further comprising curing the optical material upon application to the optical element.

3. The method of claim 2, wherein the optical material comprises a luminescent material.

4. The method of claim 3, wherein the optical material further comprises a binder and wherein curing the optical material further comprises curing the binder.

5. The method of claim 3 wherein the optical material further comprises a binder and a solvent and wherein curing the optical material comprises curing the binder and evaporating the solvent.

6. The method of claim 1, wherein the optical element comprises a LED structure.

7. The method of claim 1, wherein applying the optical material comprises:
   atomizing a luminescent solution comprising an optical material suspended in a solution using a flow of pressurized gas; and
   spraying the atomized luminescent solution onto the heated optical element using the flow of pressurized gas.

8. The method of claim 7, wherein spraying the luminescent solution comprises spraying the luminescent solution with an air pressurized spray system.

9. The method of claim 7, wherein the luminescent solution comprises wavelength conversion particles suspended in a solution including a volatile solvent and a binder material, the method further comprising evaporating the volatile solvent via thermal energy in the heated LED structure from the luminescent solution to provide a conformal layer including wavelength conversion particles on the LED structure.

10. The method of claim 7, wherein the luminescent solution comprises wavelength conversion particles suspended in a solution including a nonvolatile solvent and a binder material, the method further comprising curing the nonvolatile solvent and/or binder via thermal energy in the heated LED structure to provide a conformal layer including the wavelength conversion particles on the LED structure.

11. The method of claim 1, wherein the optical element comprises an LED chip having a top surface and a wirebond pad on the top surface, the method further comprising bonding a wire to the wirebond pad before heating the LED chip and before applying the optical material on the heated optical element.

12. The method of claim 1, wherein the optical element comprises a LED structure, further comprising:
energizing the LED structure to cause the LED structure to emit light;
testing the optical characteristics of the LED structure using the emitted light; and
in response to the optical characteristics of the LED structure not being within a predetermined binning threshold, applying additional optical material comprising wavelength conversion particles suspended in a solution including a volatile solvent and a binder material onto the heated LED structure.

13. The method of claim 1, wherein the optical element comprises an LED chip having a top surface and a wirebond pad on the top surface, the method further comprising mounting the LED within an optical cavity of an LED package before heating the LED chip and applying the optical material comprising wavelength conversion particles suspended in a solution including a solvent and a binder material onto the heated LED chip.

14. The method of claim 13, further comprising:
curing the binder material via thermal energy from the heated LED chip; and
dispensing an encapsulant material into the optical cavity over the LED chip, thereby covering the LED chip including the wavelength conversion materials and the cured binder material with the encapsulant material.

15. The method of claim 1, wherein heating the optical element comprises heating the optical element to a temperature in a range of about 90 degrees Celsius to about 155 degrees Celsius.

16. The method of claim 1, wherein heating the optical element comprises applying heat to the optical element before applying the optical material on the heated optical element.

17. The method of claim 1, wherein heating the optical element comprises applying heat to the optical element while applying the optical material on the heated optical element.

18. The method of claim 1, wherein applying the optical material onto the heated optical element comprises spraying a first layer of an atomized luminescent solution onto a heated LED structure and then spraying a second layer of an atomized luminescent solution onto the first layer of the atomized luminescent solution.

19. The method of claim 18, wherein the first layer of the atomized luminescent solution is cured before spraying the second layer of the atomized luminescent solution.

20. The method of claim 18,
wherein the atomized luminescent solution comprises a first luminescent solution that is sprayed in the first layer and a second luminescent solution that is sprayed in the second layer, and
wherein the first luminescent solution is different from the second luminescent solution.

21. The method of claim 1, wherein applying the optical material comprises:
atomizing a luminescent solution comprising an optical material suspended in a solution using a flow of pressurized gas; and
spraying the atomized luminescent solution onto the heated optical element using the flow of pressurized gas, and
wherein spraying the atomized luminescent solution onto the heated optical element comprises spraying the atomized luminescent solution onto the heated optical element using a plurality of spray heads positioned to spray towards the heated optical element at a plurality of angles relative to a surface of the heated optical element.

22. The method of claim 1, further comprising agitating the optical materials before and/or during applying an optical material.

23. The method according to Claim 1, wherein applying the optical material comprises applying the optical material on the heated plurality of LED chips that are arranged on the common surface.

24. The method according to claim 23, further comprising positioning a lens that includes a cavity that is in a receiving relationship to the plurality of LED chips.

25. The method according to claim 24, further comprising dispensing an encapsulate material within the cavity of the lens.

26. The method according to claim 25, wherein the encapsulant secures the lens to the common surface.

27. The method according to Claim 1, wherein the plurality of LED chips include a first portion of the LED chips that are configured to emit might having a first dominant wavelength and a second portion of the LED chips that are configured to emit light having a second dominant wavelength that is different from the first dominant wavelength.

28. The method according to claim 1, wherein the optical element includes an LED flip-chip having a wire bond free electrical termination.

29. The method according to claim 1, wherein applying the optical material comprises applying first phosphor particles that are configured to emit light having a first dominant wavelength.

30. The method according to claim 29, wherein applying the optical material further comprises applying second phosphor particles that are configured to emit light having a second dominant wavelength that is different from the first dominant wavelength.

31. The method according to claim 30, wherein applying the optical material further comprises applying the first phosphor particles and the second phosphor particles in a same layer.

32. The method of claim 1, wherein the optical element includes at least one beveled surface and the optical material is applied to the at least one beveled surface.

33. A method, comprising:
heating an optical element that includes at least one non-planar surface; and
after heating the optical element, applying an optical material to at least one non-planar surface on the heated optical,
wherein the optical element comprises an LED wafer, the method further comprising singulating the LED wafer into a plurality of LED chips after applying the optical material on the heated LED wafer.

34. A method, comprising:
heating an optical element that includes at least one non-planar surface; and after heating the optical element, applying an optical material to at least one non-planar surface on the heated optical element, wherein the optical element comprises an LED wafer, the method further comprising forming a plurality of sacrificial patterns on a surface of the LED wafer, wherein applying the optical material onto the heated LED structure comprises spraying an atomized luminescent solution onto the sacrificial patterns and onto exposed surfaces of the LED wafer between the sacrificial patterns.

35. The method of claim 34, further comprising:

before forming the plurality of sacrificial patterns, forming a plurality of electrical contacts on the surface of the LED wafer, wherein forming the plurality of sacrificial patterns comprises forming at least a portion of the plurality of sacrificial patterns on the plurality of electrical contacts.

36. The method of claim 34, further comprising removing the sacrificial patterns and the portion of the applied optical material on the sacrificial patterns to expose the plurality of electrical contacts.

37. A method of forming a device for interacting with emitted light, the method comprising:

heating an optical element;

applying a first conformal layer of optical material to the heated optical element;

testing a light emission characteristic of the optical element; and in response to the light emission characteristic of the optical element not being acceptable, applying a second conformal layer of optical material on the optical element.

38. The method of claim 37, wherein applying the first conformal layer comprises:

atomizing a luminescent solution comprising an optical material suspended in a solution using a flow of pressurized gas;

spraying the atomized luminescent solution onto the heated optical element using the flow of pressurized gas to provide a first conformal layer of optical material that is cured via thermal energy of the heated optical element.

39. The method of claim 38, wherein the optical element comprises an LED structure, further comprising:

before testing the light emission characteristic, allowing the heated LED structure to cool; and in response to the light emission characteristic of the LED structure not being acceptable, heating the LED structure before applying the second conformal layer.

40. The method of claim 38, wherein the first conformal layer of optical material comprises a first phosphor particle that is configured to emit light having a first wavelength in response to light emitted by the LED structure, and wherein the second conformal layer of optical material comprises a second phosphor particle that is configured to emit light having a second wavelength that is different from the first wavelength, in response to light emitted by the LED structure.

41. A method, comprising:

curing an optical material on a light transmissive optical element during application of the optical material to the light transmissive optical element, wherein curing the optical material comprises heating the light transmissive optical element before application of the optical material to the light transmissive optical element.

42. The method of claim 41, wherein the light transmissive optical element is spaced apart from a light emitting element.

43. The method of claim 42, wherein the light transmissive optical element includes a substantially transparent carrier on which the optical material is applied.

44. The method according to claim 41, wherein the light transmissive optical element includes a reflective element that is configured to receive light from the light emitting element.

* * * * *

UNITED STATES PATENT AND TRADEMARK OFFICE
CERTIFICATE OF CORRECTION

PATENT NO. : 8,940,561 B2
APPLICATION NO. : 12/717048
DATED : January 27, 2015
INVENTOR(S) : Donofrio et al.

Page 1 of 1

It is certified that error appears in the above-identified patent and that said Letters Patent is hereby corrected as shown below:

In the Claims:
Column 22, Claim 27, Line 32: Please correct "to emit might having"
to read -- to emit light having --

Signed and Sealed this
Nineteenth Day of May, 2015

Michelle K. Lee
*Director of the United States Patent and Trademark Office*